United States Patent [19]

Hwang et al.

[11] Patent Number: 5,217,809
[45] Date of Patent: Jun. 8, 1993

[54] SHAPED ARTICLES CONTAINING COPOLYMERS OF POLYBENZAZOLES

[75] Inventors: Wen-Fang Hwang, Midland; Otto C. Raspor, Saginaw; William J. Harris; Thuan P. Dixit, both of Midland, all of Mich.

[73] Assignee: The Dow Chemical Company, Midland, Mich.

[21] Appl. No.: 562,781

[22] Filed: Aug. 6, 1990

[51] Int. Cl.$^5$ .............................................. B32B 5/16
[52] U.S. Cl. ................................ 428/402; 264/331.12; 264/DIG. 42; 264/DIG. 61; 524/517; 525/419; 525/420; 525/432; 525/534
[58] Field of Search ............... 528/176, 183, 184, 185, 528/186, 188, 189, 327.1, 348; 524/517; 428/402; 525/432, 419, 420, 534; 264/331.12, DIG. 42, DIG. 61

[56] References Cited

U.S. PATENT DOCUMENTS

| | | | |
|---|---|---|---|
| 4,207,407 | 6/1980 | Helminiak et al. | 525/425 |
| 4,377,546 | 3/1983 | Helminiak et al. | 525/425 |
| 4,533,692 | 8/1985 | Wolfe et al. | 524/417 |
| 4,533,693 | 8/1985 | Wolfe | 524/417 |
| 4,703,103 | 10/1987 | Wolfe et al. | 528/179 |
| 4,772,678 | 9/1988 | Sybert et al. | 528/179 |
| 4,971,223 | 12/1990 | Arnold et al. | 525/432 |
| 5,041,506 | 8/1991 | Kumata et al. | 525/432 |
| 5,095,075 | 3/1992 | Arnold et al. | 525/432 |

FOREIGN PATENT DOCUMENTS

9003995 4/1990 PCT Int'l Appl. .

OTHER PUBLICATIONS

Harris et al., Copolymers Containing Polybenzoxazole, Polybenzothiazole and Polybenzimidazole Moieties, Ser. No. 378,360 (filed Jul. 7, 1989).
Harris et al., *Copolymers Containing Polybenzoxazole, Polybenzothiazole and Polybenzimidazole Moieties*, Ser. No. 407,973 (filed Sep. 15, 1989).
Hwang et al., *Shaped Articles Containing Copolymers of Polybenzazoles*, Ser. No. 547,650 (filed Jul. 2, 1990).
"Processing, Properties and Structure of Bulk Poly(-p-phenylene benzobisthiazole)/poly(ether ether ketone)Molecular Composites," The Materials Science & Engineering of Rigid Rod Polymers at 559 (Materials Research Soc. 1989).
K.-U. Bühler, *Spezialplaste*, 838–866 (Akademie Verlag 1978).

*Primary Examiner*—Paul J. Thibodeau
*Assistant Examiner*—Hoa T. Le

[57] ABSTRACT

Granular compositions which comprise a block copolymer containing blocks of rigid rod polybenzazole polymer and blocks of thermoplastic polybenzazole polymer can be compression molded to provide a molded article having physical properties superior to molded articles made from the thermoplastic polymer alone.

68 Claims, No Drawings

SHAPED ARTICLES CONTAINING COPOLYMERS OF POLYBENZAZOLES

STATEMENT OF GOVERNMENT INTEREST

This invention was made with government support under Contract F33615-86-C-5068 awarded by the Department of the Air Force. The government has certain rights in this invention.

BACKGROUND OF THE INVENTION

The present invention relates to the art of polybenzazole (PBZ) polymers and polymer compositions containing blocks of those polymers.

PBZ polymers, i.e., polybenzoxazole, polybenzothiazole and polybenzimidazole, and their synthesis are described in great detail in the following patents which are incorporated by reference: Wolfe et al., *Liquid Crystalline Polymer Compositions, Process and Products*, U.S. Pat. No. 4,703,103 (Oct. 27, 1987); Wolfe et al., *Liquid Crystalline Polymer Compositions, Process and Products*, U.S. Pat. No. 4,533,692 (Aug. 6, 1985); Wolfe et al., *Liquid Crystalline Poly(2,6-Benzothiazole) Compositions, Process and Products*, U.S. Pat. No. 4,533,724 (Aug. 6, 1985); Wolfe, *Liquid Crystalline Polymer Compositions, Process and Products*, U.S. Pat. No. 4,533,693 (Aug. 6, 1985); Evers, *Thermoxidatively Stable Articulated p-Benzobisoxazole and p-Benzobisthiazole Polymers*, U.S. Pat. No. 4,359,567 (Nov. 16, 1982); Tsai et al., *Method for Making Heterocyclic Block Copolymer*, U.S. Pat. No. 4,578,432 (Mar. 25, 1986) and 11 Ency. Poly. Sci. & Eng., *Polybenzothiazoles and Polybenzoxazoles*, 601 (J. Wiley & Sons 1988).

Polybenzazole polymers, and particularly "rigid rod" PBZ polymers, are noted for high tensile strength, high tensile modulus and high thermal stability. However, many polybenzazole polymers are difficult to fabricate into useful articles. Rigid and semi-rigid polybenzazoles do not have glass transition temperatures at any temperature at which they are stable. Therefore, the polymers are ordinarily spun from solution to form fibers, which serve as reinforcement within a thermosetting matrix, such as epoxy resins, to form composites. However, the fibers and the cured composites are not moldable or thermoformable.

Many moldable and thermoformable polymers are known. Exemplary polymers include thermoplastic polyamides, polyimides, polyquinolines, polyquinoxalines, poly(aromatic ether ketones) and poly(aromatic ether sulfones). However, those polymers do not have the high tensile strength and modulus which are characteristic of polybenzazole polymers.

Attempts have been made to synthesize articles which combine the processability of the thermoplastic polymer with the superior physical properties of the polybenzazole polymer. To this end, molecular composites of rigid rod polybenzazole and flexible polymers have been studied. Such molecular composites are described in numerous references, such as U.S. Pat. Nos. 4,207,407; 4,377,546; 4,631,318; 4,749,753 and 4,810,735, and Hwang et al., "Solution Processing and Properties of Molecular Composite Fibers and Films," 23 *Polymer Eng. & Sci.* 784 (1983); Hwang et al., "Phase Relationships of Rigid Rod Polymer/Flexible Coil Polymer/Solvent Ternary Systems," 23 *Polymer Eng. & Sci.* 789 (1983); and Hwang et al., "Composites on a Molecular Level: Phase Relationships, Processing and Properties," B22 *J. Macromol. Sci.-Phys.* 231 (1983), which are all incorporated herein by reference.

However, polybenzazole, and particularly rigid and semi-rigid polybenzazole, are incompatible with many thermoplastic polymers. When dopes containing polybenzazole and a thermoplastic polymer are coagulated, the polybenzazole agglomerates and/or phase separates. The resulting shaped articles either have poorer properties in all directions than the corresponding thermoplastic alone, or have superior properties in one direction and inferior properties in all other directions. Such compositions are useful for fibers, but not for molded articles.

What are needed are materials and processes which can be used to make molded articles containing reinforcing amounts of polybenzazole polymer which have superior properties in at least two dimensions and/or are not substantially phase separated.

SUMMARY OF THE INVENTION

One aspect of the present invention is a granular composition comprising a block copolymer having at least one rigid rod polybenzazole polymer block and at least one thermoplastic polybenzazole polymer block of suitable size and proportions, such that the block copolymer is thermoplastic and can be compression molded without substantial phase separation, said granular composition having an average particle diameter of no more than about 1000μ (microns).

A second aspect of the present invention is a granular composition comprising a block copolymer having at least one rigid rod polybenzazole polymer block and at least one thermoplastic polybenzazole polymer block of suitable size and proportions such that the block copolymer is flowable at a temperature below its decomposition temperature, wherein said granular composition has an average particle diameter of no more than about 1000μ.

A third aspect of the present invention is a briquette containing a granular composition of the present invention.

A fourth aspect of the present invention is a process for forming a shaped article comprising the step of molding a plurality of moldable particles that contain a block copolymer having at least one rigid rod polybenzazole polymer blocks and at least one thermoplastic polybenzazole polymer blocks of suitable size and proportions such that the block copolymer is flowable at a temperature below its decomposition temperature in a mold at a temperature at which the granular composition is flowable and a pressure sufficient to cause the granular composition to consolidate and conform to the shape of the mold.

A fifth aspect of the present invention is a molded article comprising a block copolymer having rigid rod polybenzazole polymer blocks and thermoplastic polybenzazole polymer blocks, wherein said block copolymer is not substantially phase separated.

A sixth aspect of the present invention is a molded article comprising a block copolymer having at least one rigid rod polybenzazole polymer block and and least one thermoplastic polybenzazole polymer block, wherein at least one physical property of the molded article, selected from the group consisting of the tensile strength, tensile modulus, flexural strength and flexural modulus, shows improvement in at least two dimensions over a molded article fashioned from the thermoplastic polybenzazole polymer alone.

A seventh aspect of the present invention is a molded article made by one of the processes of the present invention.

An eighth aspect of the present invention is a block copolymer comprising:
(a) at least one rigid rod polybenzazole block containing on average at least about 5 mer units and less than 10 mer units; and
(b) at least one thermoplastic polybenzazole block linked to said rigid rod polybenzazole block wherein the composition and proportions of the rigid rod polybenzazole block and the thermoplastic polybenzazole block are chosen such that the block copolymer becomes flowable at a temperature at which it does not substantially decompose.

Granular compositions and/or briquettes of the present invention can be used in the process of the present invention to fabricate the molded articles of the present invention. Such molded articles may be useful as structural elements, as circuit boards, or for any other purpose for which molded plastic articles are useful.

DETAILED DESCRIPTION OF THE INVENTION

Definitions

The following terms, which are used repeatedly throughout this application, have the meanings and preferred embodiments set out hereinafter unless otherwise specified.

AA/BB-Polybenzazole (AA/BB-PBZ)—a polybenzazole polymer characterized by mer units having a first aromatic group ($Ar^1$), a first and a second azole ring fused with said first aromatic group, and a divalent organic moiety (DM) bonded by a single bond to the 2-carbon of the second azole ring. The divalent organic moiety (DM) is chosen such that does not interfere with the synthesis, fabrication or use of the PBZ polymer; it is preferably a second aromatic group ($Ar^2$). It may, in some cases, be an alkyl group or a bond. Mer units are preferably linked by a bond from the divalent organic group (DM) to the 2-carbon of the first azole ring in an adjacent mer unit. Mer units suitable for AA/BB-PBZ polymers are preferably represented by Formula 1:

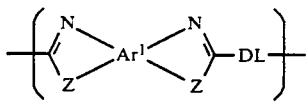

wherein Z is as defined for azole rings subsequently and all other characters have the meaning and preferred embodiments previously given.

AB-Polybenzazole (AB-PBZ)—a polybenzazole polymer characterized by mer units having a first aromatic group and a single azole ring fused with said first aromatic group. The units are linked by a bond from the 2-carbon of the azole ring in one mer unit to the aromatic group of an adjacent mer unit. Mer units suitable for AB-PBZ polymers are preferably represented by Formula 2:

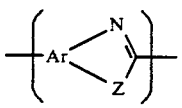

wherein Z is as defined for azole rings subsequently and all other characters have the meaning and preferred embodiments previously given.

Aromatic group (Ar)—any aromatic ring or ring system. Size is not critical as long as the aromatic group is not so big that it prevents further reactions of the moiety in which it is incorporated. Each aromatic group independently preferably comprises no more than about 18 carbon atoms, more preferably no more than about 12 carbon atoms and most preferably no more than about 6 carbon atoms. Each may be heterocyclic but is preferably carbocyclic and more preferably hydrocarbyl. If the aromatic group is heterocyclic, the heteroatom is preferably nitrogen.

Unless otherwise specified, each aromatic group may comprise a single aromatic ring, a fused ring system or an unfused ring system containing two or more aromatic moieties joined by bonds or by divalent moieties which are inert under polymerization conditions. Suitable divalent moieties comprise, for example, a carbonyl group, a sulfonyl group, an oxygen atom, a sulfur atom, an alkyl group and/or a perfluorinated alkyl group. Each aromatic group is preferably a single six-membered ring. When the aromatic group is an acylation reactive group, the divalent moiety may not contain deactivating groups, such as carbonyl or sulfonyl groups, unless they are sufficiently removed or decoupled from the reactive site for aromatic electrophilic substitution to occur.

Each aromatic group may contain substituents which are stable in solvent acid, do not interfere with further reactions of the moiety which the aromatic group is part of, and do not undergo undesirable side reactions. Examples of preferred substituents include halogens, alkoxy moieties or alkyl groups. More preferred substituents are either an alkyl group having no more than about 6 carbon atoms or a halogen. Most preferably, each aromatic group contains only those substituents specifically called for hereinafter.

Phase Separation—The existence within a coagulated article of optically distinct anisotropic domains of polymers. In shaped articles of the present invention, some phase-separation on a molecular level is inevitable, and the articles can show semicrystalline character. However, the size of domains of phase-separated polymer in the polymer compositions of the present invention is preferably on average not greater than about 1000 angstroms, highly preferably not greater than about 500 angstroms, more preferably not greater than about 200 angstroms, more highly preferably not greater than about 100 angstroms and most preferably not greater than about 50 angstroms. Phase separation may be judged by known characteristics, such as opacity, electron-microscopy, small-angle X-ray scattering or small-angle light scattering. Methods for measuring phase-separation in a system are discussed in Hwang et al., "Composites on a Molecular Level: Phase Relationships, Processing, and Properties," B22(2) J. Macromol. Sci.-Phys. 231, 234–35 (1983), which is incorporated by reference.

Polybenzazole (PBZ) polymer—A polymer from the group of polybenzoxazoles and polybenzobisoxazoles (PBO), polybenzothiazoles and polybenzobisthiazoles (PBT) and polybenzimidazoles or polybenzobisimidazoles (PBI). For the purposes of this application, the term "polybenzoxazole (PBO)" refers broadly to polymers in which each unit contains an oxazole ring bonded to an aromatic group, which need not necessarily be a benzene ring. The term "polybenzoxazole (PBO)" also refers broadly to poly(phenylene-benzobis-oxazole)s and other polymers wherein each unit comprises a plurality of oxazole rings fused to an aromatic group. The same understandings shall apply to the terms polybenzothiazole (PBT) and polybenzimidazole (PBI). Polybenzazole polymers used in the present invention are preferably polybenzoxazole or polybenzothiazole, and more preferably polybenzoxazole.

Rigid Rod PBZ polymer—An "intrinsic" or "articulated" rigid rod PBZ polymer as the terms "intrinsic" and "articulated" are defined in the Hwang, "Processing, Structure and Properties of Liquid Crystalline PBT Polymer," Kansai Committee of the Society of Fiber Science and Technology, Japan, Post Symposium on Formation, Structure and Properties of High Modulus and High Tenacity Fibers 23–26 (Aug. 26, 1985); Evers et al, "Articulated All-Para Polymers with 2,6-Benzobisoxazole, 2,6-Benzobisthiazole, and 2,6-Benzobisimidazole Units in the Backbone," 14 Macromolecules 925 (1981); Evers, "Thermoxidatively Stable Articulated Benzobisoxazole and Benzobisthiazole Polymers," 24 J. Poly. Sci. Part A 1863 (1986) and Evers et al., *Articulated Para-Ordered Aromatic Heterocyclic Polymers Containing Diphenoxybenzene Structures,* U.S. Pat. No. 4,229,566 (Oct. 21, 1980).

Intrinsic rigid rod polymers are essentially rectilinear and are theorized to have a persistence length comparable to their contour length. They contain essentially no angles of catenation less than 150°. Articulated rigid rod polymers comprise a plurality of essentially rectilinear moieties joined by a relatively small number of moieties which are not rectilinear and have angles of catenation less than 150°. Rigid rod PBZ polymers used in the present invention are preferably intrinsic rigid rod polymers.

Solvent acid—any non-oxidizing liquid acid capable of dissolving PBZ polymers, such as sulfuric acid, methanesulfonic acid, trifluoromethylsulfonic acid, polyphosphoric acid and mixtures thereof, which is suitable for carrying out azole-ring formation or acylation or sulfonation reactions that form block copolymers used in the present invention. It must be sufficiently non-oxidizing that it does not substantially oxidize AB- and BB-PBZ monomers which are dissolved therein. Solvent acids are preferably dehydrating acids, such as polyphosphoric acid or a mixture of methanesulfonic acid and phosphorus pentoxide and/or polyphosphoric acid. Polyphosphoric acid preferably has a $P_2O_5$ content by weight of at least about 75 percent, more preferably at least about 78 percent and preferably has a $P_2O_5$ content of at most about 90 percent, more preferably at most about 85 percent. The ratio of methanesulfonic acid to phosphorus pentoxide in mixtures of those compounds is preferably no more than about 20:1 by weight; and preferably no less than about 1:1, more preferably no less than about 5:1 by weight. However, certain solvent acids, such as trifluoromethanesulfonic acid, are suitable for carrying out acylation or sulfonation reactions even though they do not contain a dehydrating component, such as phosphorus pentoxide.

DESCRIPTION OF THE INVENTION

The present invention uses thermoplastic polybenzazole block copolymers containing blocks of rigid rod polybenzazole polymer and blocks of thermoplastic polybenzazole polymer. Some suitable block copolymers and processes to make them are described in detail in Wolfe et al., *Liquid Crystalline Polymer Compositions, Process and Products,* U.S. Pat. No. 4,533,693 (Aug. 6, 1985) (col. 74–79 and Examples 89, 93 and 94); and Harris et al., *Thermoplastic Compositions Containing Polybenzoxazole, Polybenzothiazole and Polybenzimidazole Moieties,* Ser. No. 327,926 (filed Mar. 23, 1989), which are incorporated herein by reference. The block copolymers contain a rigid rod polybenzazole block and a thermoplastic non-rigid polybenzazole block.

The rigid rod polybenzazole block may be articulated or intrinsic, but is preferably intrinsic. It preferably consists essential of AA/BB mer units, although articulated rigid rod blocks may contain a minor percentage of AB mer units. The rigid rod block may contain polybenzoxazole, polybenzothiazole, and/or polybenzimidazole mer units. It preferably consists essentially of polybenzoxazole and/or polybenzothiazole mer units. It more preferably consists essentially of polybenzoxazole mer units.

Each rigid rod polybenzazole block contains on average at least about 5 mer units and preferably at least about 8 mer units. Each rigid rod polybenzazole block preferably contains on average at most about 150 mer units, more preferably at most about 100 mer units, and most preferably at most about 50 mer units. Theoretically, block copolymers having larger rigid polybenzazole blocks, such as at least about 10–20 mer units on average, should ordinarily have higher tensile strength and modulus than polymers having smaller average rod lengths, such as about 5–10 mer units. However, the block copolymers containing smaller rigid rod polybenzazole segments are frequently more flowable and easier to obtain complete consolidation under molding conditions. Thus, the molded article made from block copolymer having a smaller average rod length may have better physical properties under particular molding conditions.

The thermoplastic blocks may contain any thermoplastic polybenzazole polymer. The reference K.-U. Bühler, *Spezialplaste* 838–866 (Akademie-Verlag 1978), which is incorporated herein by reference, reports in Table 158 from 844–854 the structures and synthesis of many PBZ polymers for which the reference also reports glass transition temperatures. Thermoplastic polybenzazole polymer blocks preferably are taken from one or both of two species.

The first species of thermoplastic polybenzazole polymer, hereinafter referred to as jointed polybenzazole, contains a plurality of AA/BB-mer units, in which:

(1) the first aromatic group ($Ar^1$) is an unfused ring system containing at least two aromatic groups linked by a bond or a first divalent linking moiety (X), which does not interfere with the synthesis, fabrication or use of the block copolymer; and (2) the divalent organic moiety (DM) is a non-linear group (L), which is not substantially rectilinear and does not interfere with the synthesis, fabrication or use of the block copolymer.

Each non-linear group (L) may comprise a meta-aromatic group ($Ar^m$), such as an m-phenylene moiety, an m-pyridinylene moiety, a 3,4'-biphenylene moiety, a 4,3'-biphenylene moiety, a 3,3'-biphenylene moiety or a 2,6-naphthalene moiety. Alternatively, each non-linear group (L) may contain an aliphatic moiety wherein the azole rings are bonded to the same carbon atom or adjacent carbon atoms in the aliphatic moiety. Alternatively and preferably, each non-linear group (L) comprises two aromatic groups (Ar) linked by a second divalent linking moiety (X'). Aromatic groups conform to the descriptions and preferred embodiments previously defined for aromatic groups.

The first and second divalent linking moieties (X and X') preferably independently comprise a sulfonyl moiety, an oxygen atom, a sulfur atom or an aliphatic group and more preferably comprise either a sulfonyl moiety or an oxygen moiety. More highly preferably, the first divalent linking moiety (X) comprises a sulfonyl moiety and the second divalent linking moiety (X') comprises an oxygen atom. Most preferably, the first divalent linking moiety is a sulfonyl moiety and the second divalent linking moiety is an oxygen atom. It is within the scope of the present invention for either or both divalent linking moieties to comprise two oxygen atoms, sulfur atoms, sulfonyl moieties or aliphatic moieties linked by an aromatic group.

When the non-linear group (L) comprises an aliphatic group, the aliphatic group preferably comprises no more than about 12 carbon atoms. The aliphatic group may be cyclic or branched. It is preferably alkyl or halogenated alkyl. Examples of suitable aliphatic groups include a 1,2-cyclohexyl moiety and a perfluoroisopropylidene moiety. As previously described, in jointed polybenzazole the bonds to the aliphatic moiety are preferably to the same carbon atom or to adjacent carbon atoms. Thermoplastic polybenzazole polymers in which the non-linear group is aliphatic and the bonds from the azole rings are not to the same or adjacent carbons are not outside the scope of the present invention, but are more appropriately considered as "aliphatic polybenzazole polymers," the second species of thermoplastic polybenzazole.

Due to the high glass transition temperatures of jointed polybenzazole polymers, aliphatic moieties within jointed polybenzazole polymers are preferably perfluorinated, such as perfluoroisopropylidene, to add temperature stability. Synthesis of polybenzazole polymers containing perfluorinated aliphatic groups is described in Maruyama et al., "Synthesis and Properties of Fluorine-Containing Aromatic Polybenzoxazoles from Bis(o-aminophenols) and Aromatic Diacid Chlorides by the Silylation Method," 21(8) i Macromolecules 2305 (1988), which is incorporated herein by reference.

Mer units for jointed polybenzazole polymer preferably comply with Formula 11

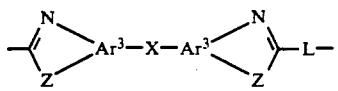

wherein:
X is a bond or the first divalent linking moiety as previously defined;
each $Ar^3$ is an aromatic group as previously defined;
L is a non-linear group as previously defined; and
all other characters have the meanings previously assigned.

When L comprises an m-aromatic group ($Ar^m$), it may be, for example, one of the groups set out in Formula 12(a)–(d)

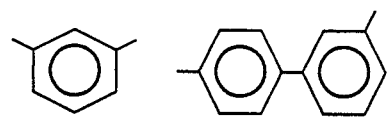

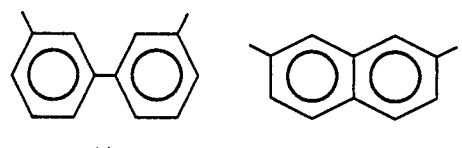

or a substituted or heterocyclic variation thereof, such as an m-pyrimidinyl moiety.

When L comprises two aromatic groups joined by a second divalent linking moiety, it preferably conforms to Formula 13

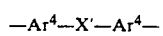

wherein X' is a second divalent linking moiety. Bonds to each $Ar^4$ are preferably in meta or para position with respect to each other and more preferably in para position.

X and X' preferably independently conform to Formula 14(a) or (b)

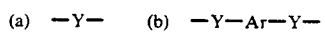

wherein each Y is independently a sulfonyl moiety, an oxygen atom, a sulfur atom or an aliphatic moiety. Each Y is preferably a sulfonyl moiety or an oxygen atom.

Mer units in jointed polybenzazole more preferably comply with Formula 15(a)

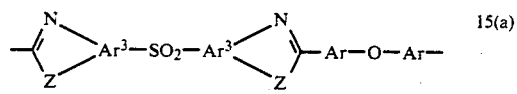

and most preferably conform with the Formula 15(b)

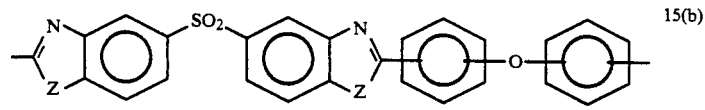

or the variation thereof wherein the sulfonyl group is bonded to the AB-PBZ moieties meta to the Z groups and para to the nitrogen atoms.

A second species of thermoplastic polybenzazole polymer, hereinafter referred to as "aliphatic polybenzazole," contains a plurality of mer units each of which comprises (1) an aromatic group ($Ar^a$) as that term is previously defined;
(2) a first azole ring fused to said aromatic group; and
(3) an aliphatic group ($R^1$) having at least 3 carbon atoms bonded to the 2 carbon of said first azole ring.

Each mer unit preferably further contains:
(4) a second azole ring fused to said aromatic group (Ar$^a$).

Mer units comprising only one azole ring (aliphatic AB-PBZ) are linked by a bond from the aliphatic group (R$^1$) of one mer unit to the aromatic group (Ar$^a$) of an adjacent mer unit. Mer units containing two azole rings (aliphatic AA/BB-PBZ) are linked by a bond from the aliphatic group (R$^1$) of one mer unit to the 2-carbon of the second azole ring of an adjacent mer unit. Within the aliphatic group (R$^1$), aromatic groups and/or azole rings should not be bonded to the same carbon atom or to adjacent carbon atoms, i.e., the first azole ring of one mer unit should be bonded to the aliphatic group in at least Y position with respect to the aromatic group or second azole ring of the adjacent mer unit.

Mer units within aliphatic polybenzazole polymers preferably comply with one of formulae 18(a) and (b)

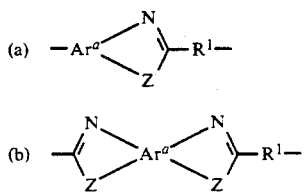

wherein Ar$^a$ is the aromatic group as previously described, R$^1$ is the aliphatic group as previously described and all other characters have the meanings previously assigned.

The aromatic group (Ar$^a$) has the meaning and preferred embodiments previously given for aromatic groups. It may optionally comprise two aromatic groups linked by a divalent linking moiety (X), as that term is previously defined.

The size of the aliphatic group (R$^1$) is not critical as long as the group comprises at least 3 carbon atoms and is small enough that it can be synthesized and reacted. The aliphatic group preferably comprises no more than about 12 carbon atoms, more preferably no more than about 10 carbon atoms and most preferably no more than about 8 carbon atoms. It may be cyclic or branched. Neither variation is critical. Unbranched monomers are preferred because they are readily available. The aliphatic group may be fluorinated for better thermal stability. The aliphatic group is highly preferably alkyl or perfluoroalkyl.

Aliphatic AB-PBZ polymer blocks can be synthesized by known processes, such as by (1) formation of the corresponding amide in a system of triphenyl phosphine, hexachloroethane and pyridine and (2) thermal cyclization of the amide, as described in Mathias et al., "Two-Step Synthesis of Alkyl- and Alkenylbenzoxazole Polymers," 18 *Macromolecules* 616 (1985).

The thermoplastic polybenzazole blocks comprise a plurality of mer units. Each preferably comprises by number average at least about 5 mer units, more preferably at least about 10 mer units, and most preferably at least about 20 mer units. The thermoplastic polybenzazole blocks preferably have an average formula weight of at least about 800.

The proportion of rigid rod polybenzazole block to thermoplastic polybenzazole block are chosen so that the entire block copolymer is thermoplastic. The block copolymer may contain between about 1 percent and about 99 percent thermoplastic polybenzazole block by weight. It preferably contains at least about 10 percent thermoplastic polybenzazole block by weight, more preferably contains at least about 30 percent thermoplastic polybenzazole block by weight, and most preferably contains at least about 70 percent thermoplastic polybenzazole block by weight. It preferably contains at least about 3 percent rigid rod polybenzazole block by weight and more preferably contains at least about 5 percent rigid rod polybenzazole block by weight. The block copolymer should become flowable at a temperature at which it does not substantially decompose.

Theoretically, block copolymers containing higher proportions of rigid rod polybenzazole may frequently provide superior physical properties as fabricated. However, block copolymers containing lower proportions of rigid rod polybenzazole may be more flowable and thus may consolidate better to provide a molded article having superior properties. The proportions of rigid rod polybenzazole block to thermoplastic polybenzazole block are preferably chosen such that the block copolymer flows and the granular composition consolidates during molding to provide a molded article having physical properties superior to molded articles made from the thermoplastic polybenzazole homopolymer alone. Those optimum proportions vary depending upon the specific polymers and block sizes used in the block copolymer, but can readily be determined experimentally by persons of ordinary skill in the art.

The average molecular weight of the block copolymer as a whole also affects the flowability of the block copolymer. The average molecular weight should be kept low enough that the granular composition consolidates during molding to provide a molded article having physical properties superior to molded articles made from the thermoplastic polybenzazole homopolymer alone. Molecular weight may be regulated either by adjusting the stoichiometry of the reaction or by use of a chain terminator. Many different monofunctional reagents may be used as chain terminators, as described in U.S. Pat. No. 4,703,103, which is incorporated herein by reference, but monofunctional aromatic carboxylic acid derivatives such as benzoic acid and benzoyl chloride are preferred. The optimum average molecular weight varies depending upon the specific polymers, block sizes and proportions of blocks used in the block copolymer, but can readily be determined experimentally by persons of ordinary skill in the art.

Compositions and molded articles of the present invention may consist essentially of a block copolymer as previously described. Alternatively, compositions and molded articles of the present invention may contain thermoplastic polymers or rigid rod polybenzazole polymers which are not part of a block copolymer, or both. The polymers are preferably selected such that the physical properties of the molded composition are superior to physical properties of the thermoplastic polybenzazole polymer alone, in at least two dimensions. The polymers are more preferably selected such that the composition does not experience substantial phase separation during coagulation or molding. If the composition contains a thermoplastic polymer, it is preferably a thermoplastic polybenzazole polymer. It is more preferably a homopolymer or copolymer having a structure similar to the thermoplastic polybenzazole blocks of the block copolymer. Examples of thermoplastic polybenzazole polymers may include those described in previously named references, as well as those described in Ser. No. 313,936 (filed Feb. 22, 1989), which is incorporated herein by reference.

The concentration of rigid rod polybenzazole polymer in the composition should be low enough that the composition is moldable. The concentration of rigid rod polybenzazole is more preferably low enough that the polymer composition does not exhibit substantial phase separation.

The block copolymers and polymer compositions containing them are ordinarily formed in a solvent acid solution or dope, from which they may be coagulated by contacting the dope with a non-solvent diluent such as water. The dope must ordinarily be in an optically isotropic (non-liquid crystalline) state when coagulated in order to form a coagulated product which is at least substantially planar isotropic (isotropic in two dimensions) and is more preferably isotropic in three dimensions. The coagulated product is most preferably not substantially phase separated. Liquid crystalline dopes tend to form phase separated and anisotropic coagulated products.

Optical isotropy and anisotropy of the dope can be determined by a number of tests familiar to persons of ordinary skill in the art, such as those described in Hwang et al., "Composites on a Molecular Level: Phase Relationships, Processing, and Properties," B22(2) J. Macromol. Sci.-Phys. 231, 234-35 (1983), which is incorporated by reference. A simple method is to see if the solution exhibits birefringence when viewed under a microscope under cross-polar conditions. Within even optically isotropic solutions, some association of rigid rod blocks is inevitable on a molecular scale. However, in polymers precipitated from the optically isotropic phase, the level of anisotropy and phase-separation is preferably small enough to provide a block copolymer or polymer composition which is essentially a molecular composite.

The point at which a given dope changes from optically isotropic to anisotropic phase and the reverse varies as a function of many factors, such as the concentration of the polymer, the solvent, the size and concentration of rigid rod PBZ blocks within the polymers in the dope, the temperature of the dope and other factors. The parameter most easily controlled is concentration of the block polymer and any homopolymer. It is convenient to synthesize the block copolymer in a solution having a low enough concentration to avoid the anisotropic phase. If an anisotropic dope is formed, it may be diluted with solvent acid until an optically isotropic state is reached.

The preferred concentration of polymer in optically isotropic dopes of the present invention varies depending upon the portion of the polymer which is rigid rod polybenzazole. If the polymer in the dope contains only about 5 weight percent rigid rod PBZ block or less, then the concentration of polymer in the dope may be as high as the solvent acid can dissolve, such as about 50 weight percent or less. If the polymer contains about 30 weight percent rigid rod PBZ block, then the dope preferably comprises no more than about 15 weight percent polymer. If the polymer contains about 50 weight percent rigid rod PBZ block, then the dope preferably comprises no more than about 10 weight percent polymer. If the polymer comprises about 70 weight percent rigid rod PBZ block, then the dope preferably comprises no more than about 6 weight percent polymer and more preferably no more than about 4 weight percent polymer.

The solvent acid in the dope has the definition and preferred embodiment previously given for solvent acids. It is most conveniently the solvent acid in which the block copolymer was synthesized. However, the block copolymer may be synthesized in a first solvent acid such as polyphosphoric acid, coagulated, and redissolved in a second solvent acid such as methanesulfonic acid.

The dope may also contain other additives that precipitate with the polymers, such as stabilizers or coloring agents. Preferably, such additives are minimized.

The polymer is recovered from the dope by contacting the dope with a non-solvent which causes the block copolymer to coagulate. The non-solvent is preferably aqueous. The non-solvent may be basic or slightly acidic, but is preferably about neutral at the commencement of its use. Of course, the non-solvent bath may become progressively more acidic as it coagulates more dope unless the non-solvent in the bath has a reasonably steady flow of non-solvent to and from the bath or a pH adjusting material is added.

Large coagulated particles of block copolymers and compositions containing them may be difficult to grind or pulverize to make granular compositions of the present invention. Therefore, it is preferable to coagulate the dope directly in a granular form. This can be carried out by a number of processes.

For instance, the dope may be frozen. The dope is preferably frozen at a temperature less than 0° C., more preferably at most about −78° C., more highly preferably at most about −150° C. and most preferably at most about −190° C. A convenient temperature is liquid nitrogen temperature. The frozen dope is more easily ground than is the coagulated polymer and may be ground on ordinary grinding equipment suitable for grinding the frozen solvent acid, such as a ball mill or attrition mill. The ground dope is then placed in a relatively warmer non-solvent bath, which causes the dope to melt and the polymer to coagulate. The bath must be at a temperature above the freezing point of the dope. It is preferably at a temperature of at least about 10° C., and is more preferably at a temperature no higher than about 50° C. A convenient temperature is room temperature. Freeze-grinding and apparatuses to carry it out are described in the following U.S. Pat. Nos.: 2,216,094; 2,836,368; 3,453,221; 3,868,997; 4,069,161; 3,936,517; 3,614,001; 3,658,259; 3,713,592; 3,771,729; 4,072,026; and 4,273,294, which are incorporated herein by reference.

Alternatively, the dope may be sprayed in a fine mist into a coagulation bath. The coagulation bath is preferably agitated or otherwise in motion. The powders resulting from either method are preferably filtered, washed, and dried in order to recover the granular composition. Spray extraction of polymers and equipment for carrying it out are described in the following U.S. Pat. Nos.: 3,953,401; 4,100,236; 4,206,161 and 4,469,818; which are incorporated herein by reference.

The resulting granular product should have an average particle size small enough to be molded into a solid article. The average particle diameter is preferably no more than about 500μ, more preferably no more than about 100μ, more highly preferably no more than about 50μ, and most preferably, no more than about 10μ.

The particles are preferably homogeneous, having approximately the same mixtures and proportions of polymers as were found in the dope. Polymer within the particles is preferably isotropic in at least two dimensions (planar isotropic), and is more preferably isotropic in three dimensions.

Granular compositions of the present invention may be molded as they are, but they are conveniently pressed to form a briquette for easier handling. The briquette is formed by subjecting the powder to a pressure high enough to press it together so that it will not fall apart again when pressure is released. The pressure is preferably at least about 50 psi, more preferably at least about 500 psi, and most preferably at least about 2000 psi. The preferred size of the briquette is limited primarily by practical considerations. It must be of an appropriate size for the mold in which it will be used.

Moldable particles containing block copolymers and/or polymer compositions, as previously described, may be molded by heating under pressure in a mold. The moldable particles are preferably granular compositions of the present invention, either in granular or briquette form. Larger particles, such as pellets may also be used, if the block copolymer and/or polymer composition are sufficiently flowable under molding conditions to consolidate moldable pellets into a shaped article having desirable properties.

The molding process takes place in a mold, which may be as simple as two heated platens for making a flat plaque or may be complex, such as the shape of a part, etc. The granular composition may be molded in the mold alone, or fibers may be intermixed with the granular composition such that the resulting molded product is a fiber reinforced composite. Examples of suitable fibers include aramid fibers, carbon fibers, glass fibers, ceramic fibers, quartz fibers and polybenzazole fibers. The granular composition may also be molded in a mixture with granular additives, such as stabilizers, fillers, coloring agents, rubber modifiers or other additives.

The temperature and pressure of molding are chosen so that the individual particles of the granular composition fuse to form a single article. Optimum temperature, pressure and time of molding necessarily depend upon the flowability of the polymers in the granular composition. Copolymers that contain longer rigid or semi-rigid segments, contain higher concentrations of rigid and semi-rigid segments and have higher average molecular weights ordinarily require higher molding temperatures and pressures and longer molding times than similar copolymers that contain shorter rigid or semi-rigid segments, contain lower concentrations of rigid and semi-rigid segments and/or have lower average molecular weights.

The temperature should be at least about the glass transition temperature of the granular composition. It is preferably at least about 5° to 10° C. above the glass transition temperature of the granular composition. It should also be below the temperature at which substantial decomposition occurs in the granular composition. The preferred temperatures are highly dependent upon the chemical and physical make-up of the granular composition. For granular compositions containing jointed polybenzazole as the thermoplastic portion of the block copolymer, the molding temperature is preferably at least about 200° C., more preferably at least about 250° C., and most preferably at least about 350° C. For granular compositions containing aliphatic polybenzazole as the thermoplastic portion of the block copolymer, the molding temperature is preferably at least about 200° C., more preferably at least about 230° C., and most preferably at least about 270° C. For granular compositions containing jointed polybenzazole as the thermoplastic portion of the block copolymer, the molding temperature is preferably at most about 500° C., more preferably at most about 475° C., and most preferably at most about 450° C. For granular compositions containing aliphatic polybenzazole as the thermoplastic portion of the block copolymer, the molding temperature is preferably at most about 400° C., more preferably at most about 350° C., and most preferably at most about 300° C. Optimum temperatures for each granular composition may be determined without undue experimentation by persons of ordinary skill in the art.

The pressure may be any pressure at which individual particles in the granular composition will fuse and consolidate to form a single article. Preferred pressure is also dependent upon the physical and chemical make-up of the granular composition and upon the temperature at which molding occurs. The pressure is preferably as low as is necessary to obtain sufficient consolidation of the powder to make a molded product. The pressure is preferably no more than about 50,000 psi, more preferably no more than about 10,000 psi and most preferably no more than about 5000 psi. To obtain good consolidation the pressure is ordinarily at least about 50 psi, more typically at least about 500 psi and most often at least about 1000 psi. Optimum pressure may be determined by persons of ordinary skill in the art without undue experimentation.

The molded article may optionally be annealed after it is molded. The annealing preferably takes place at a temperature above the glass transition temperature of the polymer in the molded article, but below its melting point. Annealing more preferably takes place at a temperature close to the melting point of the polymer. Annealing may take place at subatmospheric or superatmospheric pressures, but is conveniently at about atmospheric pressure. The atmosphere for annealing is preferably air or nitrogen, but may be any other atmosphere in which the polymer is essentially stable under annealing conditions. Annealing typically causes an increase in the tensile strength and elongation of the molded article, but may also cause a slight decrease in the tensile modulus of the molded article.

The product of the molding process is a molded article containing the block copolymers previously described, wherein the granules of the granular composition are fused together. The fusion of individual particles may be less than perfect and complete, but the molded article is preferably essentially void free. The polymer in the molded article is preferably at least substantially planar isotropic and more preferably substantially isotropic in all dimensions. The molded article may exhibit some crystalline zones.

The molded article preferably has physical properties which are superior to the physical properties of similar molded articles that contain only polymers similar to the thermoplastic polybenzazole block of the block copolymer. For instance, the molded article may have higher tensile strength, tensile modulus, flexural modulus, flexural strength, dimensional stability and/or solvent resistance. The improvement in properties is preferably exhibited in at least two perpendicular dimensions and more preferably in all directions. In other words, the improvement is at least biaxial, rather than uniaxial. The improvement in properties need not be uniform in all directions, but it preferably is about uniform.

The molded article is preferably not substantially phase separated. It is not a fiber. It preferably has a thickness of at least about 5 mil, more preferably at least about 10 mil, and most preferably at least about ⅛ inch. The maximum thickness is limited primarily by practical considerations, such as scale of equipment and the ability to heat the sample to a proper temperature throughout. It may be used as a structural material or as an electronic substrate or for any other use in which a thermoplastic polybenzazole polymer corresponding to the thermoplastic portion of the block copolymer would have been suitable.

ILLUSTRATIVE EXAMPLES

The following examples are given to illustrate the invention and should not be interpreted as limiting it in any way. Unless stated otherwise, all parts and percentages are given by weight. Unless otherwise stated, all inherent viscosities are in methanesulfonic acid at 25° C. and a concentration of 0.05 g/dL.

Example 1—Granular compositions containing a block copolymer of 5 percent rigid rod cis-polybenzoxazole and 95 percent aliphatic polybenzoxazole, and molded articles made from them A functionally terminated rigid rod cis-polybenzoxazole block is prepared which has an inherent viscosity of 5.77 dL/g, is predominantly terminated at each end by an o-amino-hydroxy moiety, and consists essentially (except for the end groups) of mer units represented by the Formula:

The functionally terminated block is reacted in a mixture of methanesulfonic acid and polyphosphoric acid with 4,6-diaminoresorcinol dihydrochloride and sebacic acid. The process is described in detail in Harris et al., *Thermoplastic Compositions Containing Polybenzoxazole, Polybenzothiazole and Polybenzimidazole*, U.S. patent application Ser. No. 327,926 (filed Mar. 23, 1989), which is incorporated herein by reference. The concentration of solids in the reaction mixture is sufficient to provide a dope containing about 2 weight percent solids, and the ratio of monomers to functionally terminated block is suitable to provide a block copolymer containing about 5 weight percent rigid rod block and about 95 weight percent aliphatic polybenzoxazole block. No terminator is added.

The resulting dope is frozen at liquid nitrogen temperature and ground for two hours using 7.4 lbs. of ceramic balls. The frozen granular composition is coagulated in a blender in phosphate buffered slurry with crushed ice while periodically adding aqueous sodium hydroxide as needed to maintain the pH of the system at about 7 to 8. The precipitated granular composition is filtered, washed twice in deionized water and once in acetone for several hours each washing, and dried under air and in a vacuum oven to constant weight.

A quantity of powder as shown in Table 1 is pressed under about 20,000 pressure at room temperature for about 10 seconds to form a briquette.

Each briquette is molded at the temperature and pressure shown in Table 1 for the time shown in Table 1 to form a disk having a thickness of about 1/16-inch (0.16 cm) and a diameter of about 2½-inches (6.4 cm). Each disk is tested for flexural strength and modulus by the test described in ASTM D-790. It has the strength, modulus and strain shown in Table 1.

TABLE 1

| Sample | Quantity of Granular Comp. | Molding Temp (°C.) | Molding Pressure (ksi)[1] | Molding Time (min) | Flex Modulus (ksi) | Flex Strength (ksi) |
|---|---|---|---|---|---|---|
| 1 | 7.3 | 325 | 5 | 3 | 342 | 11.7 |
| 2 | 7.4 | 300 | 5 | 3 | 325 | 10.6 |
| 3 | 7.4 | 325 | 5 | 30 | 355 | 12.0 |
| 4 | 7.3 | 300 | 5 | 10 | 323 | 10.1 |

[1] 1 ksi = 1000 psi

Example 2—Granular compositions containing a block copolymer of 5 percent rigid rod cis-polybenzoxazole and 95 percent aliphatic polybenzoxazole, and molded articles made from them A functionally terminated rigid rod cis-polybenzoxazole block is prepared which has an inherent viscosity of 5.1 dL/g, is predominantly terminated at each end by an o-amino-hydroxy moiety, and consists essentially (except for the end groups) of mer units represented by the Formula:

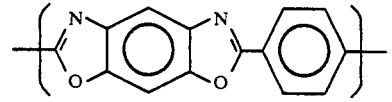

The functionally terminated block is reacted in polyphosphoric acid with 4,6-diaminoresorcinol dihydrochloride and sebacic acid. The process is described in detail in Harris et al., *Thermoplastic Compositions Containing Polybenzoxazole, Polybenzothiazole and Polybenzimidazole*, U.S. patent application Ser. No. 327,926 (filed Mar. 23, 1989), which is incorporated herein by reference. The concentration of solids in the reaction mixture is sufficient to provide a dope containing about 3 weight percent solids, and the ratio of monomers to functionally terminated block is suitable to provide a block copolymer containing about 5 weight percent rigid rod block and about 95 weight percent aliphatic polybenzoxazole block. 2-aminophenol is added as a terminator in a quantity equal to 5 weight percent of the diaminoresorcinol that is reacted with sebacic acid. The resulting polymer has an intrinsic viscosity of 7.93 dL/g.

The resulting dope is coagulated in a blender in phosphate buffered aqueous coagulation bath while periodically adding aqueous sodium hydroxide as needed to maintain the pH of the system at about 7 to 8. The precipitated granular composition is filtered, washed several times in deionized water, filtered, and dried in air and in a vacuum oven to constant weight.

A 7.3 g quantity of powder is pressed under about 20,000 pressure at room temperature for about 10 seconds to form a briquette.

The briquette is molded at 225° C. and 20,000 psi pressure for 3 minutes to form a disk having a thickness of about 1/16-inch (0.16 cm) and a diameter of about 2½-inches (6.4 cm). Each disk is tested for flexural strength and modulus by the test described in ASTM D-790. It has a flexural strength of 4,705 psi and a flexural modulus of 371,000 psi.

What is claimed is:

1. A granular composition comprising a block copolymer having at least one rigid rod polybenzazole polymer block and at least one thermoplastic polybenzazole polymer block selected such that the block copolymer is thermoplastic and can be compression molded without substantial phase separation, said granular composition having an average particle diameter of no more than about 1000μ.

2. The granular composition of claim 1 wherein the thermoplastic polybenzazole polymer blocks contain a jointed polybenzazole polymer having a plurality of mer units that contain:
   (a) a first aromatic group (Ar¹) that is an unfused ring system containing at least two aromatic groups linked by a bond or a first divalent linking moiety (X), which does not interfere with the synthesis, fabrication or use of the block copolymer,
   (b) a first and a second azole ring fused with said first aromatic group, and
   (c) a non-linear divalent organic moiety (L), which is not substantially rectilinear and does not interfere with the synthesis, fabrication or use of the block copolymer bonded by a single bond to the 2-carbon of the second azole ring.

3. The granular composition of claim 2 wherein the thermoplastic polybenzazole polymer blocks is represented by the Formula:

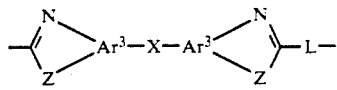

wherein:
X is a bond or a sulfonyl moiety, an oxygen atom, a sulfur atom or an aliphatic group;
each Ar³ is a carbocyclic aromatic group containing no more than about 12 carbon atoms;
L is a non-linear divalent organic moiety; and
each Z is —O—, —S— or —NR— wherein R is a hydrogen atom, a C₁-C₆ alkyl group or a phenyl ring.

4. The granular composition of claim 3 wherein the non-linear divalent organic moiety in the thermoplastic block of the block copolymer contains an m-phenylene moiety, an m-pyridinylene moiety, a 3,4'-biphenylene moiety, a 4,3'-biphenylene moiety, a 3,3'-biphenylene moiety or a 2,6-naphthalene moiety.

5. The granular composition of claim 3 wherein the non-linear divalent organic moiety in the thermoplastic block of the block copolymer is an aliphatic moiety having no more than about 12 carbon atoms, having two single bonds from either the same carbon atom or adjacent carbon atoms to two separate azole rings.

6. The granular composition of claim 5 wherein each non-linear divalent organic moiety in the thermoplastic block of the block copolymer is an alkyl group or perfluorinated alkyl group.

7. The granular composition of claim 3 wherein the non-linear divalent organic moiety in the thermoplastic block of the block copolymer contains two aromatic groups (Ar) linked by a second divalent linking moiety (X') which is a sulfonyl moiety, an oxygen atom, a sulfur atom or an aliphatic group.

8. The granular composition of claim 7 wherein the first and second divalent linking moieties in the thermoplastic block of the block copolymer are each individually a sulfonyl group or an oxygen atom.

9. The granular composition of claim 8 wherein each thermoplastic block in the block copolymer consists essentially of a plurality of mer units which are represented by the Formula:

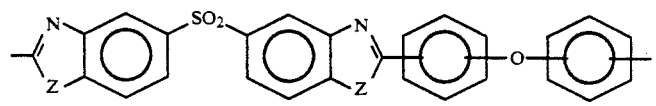

wherein each Z is an oxygen atom or a sulfur atom.

10. The granular composition of claim 1 wherein each thermoplastic block in the block copolymer is an aliphatic polybenzazole polymer.

11. The granular composition of claim 10 wherein each thermoplastic block in the block copolymer contains a plurality of mer units that each contain:
   (1) an aromatic group (Arᵃ) having no more than about 12 carbon atoms;
   (2) a first azole ring fused to said aromatic group; and
   (3) an aliphatic group (R¹) having at least 3 carbon atoms bonded to the 2 carbon of said first azole ring.

12. The granular composition of claim 11 wherein each thermoplastic block in the block copolymer contains a plurality of mer units that each further contain:
   (4) a second azole ring fused to said aromatic group (Arᵃ).

13. The granular composition of claim 12 wherein each thermoplastic block in the block copolymer contains a plurality of mer units which are represented by the Formula:

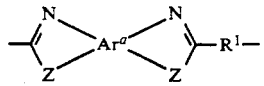

wherein:
R¹ is an alkyl group or perfluorinated alkyl group having 3-12 carbon atoms in which the illustrated bonds are not to the same carbon atom or to adjacent carbon atoms:
Arᵃ is the aromatic group having no more than about 12 carbon atoms; and
each Z is independently an oxygen atom or a sulfur atom.

14. The granular composition of claim 1 wherein each rigid rod polybenzazole polymer block contains on average between about 5 and about 150 mer units.

15. The granular composition of claim 1 wherein each azole ring in the block copolymer is independently an oxazole or a thiazole ring.

16. The granular composition of claim 1 wherein the ratio of rigid rod polybenzazole polymer to thermoplastic polybenzazole polymer is between 1/99 and 70/30 by inclusive weight.

17. The granular composition of claim 16 wherein the ratio of rigid rod polybenzazole polymer to thermoplastic polybenzazole polymer is no more than about 30/70 by weight.

18. The granular composition of claim 1 wherein the average particle size of the composition is between about 1μ and about 250μ.

19. A briquette containing a granular composition of claim 1.

20. A granular composition comprising a block copolymer having at least one rigid rod polybenzazole polymer block and at least one thermoplastic polybenzazole polymer block selected such that the block copolymer is flowable at a temperature below its decomposition temperature, wherein said granular composition has an average particle diameter of no more than about 1000μ.

21. The granular composition of claim 20 wherein the thermoplastic polybenzazole polymer blocks contain a jointed polybenzazole polymer having a plurality of mer units that contain:
(a) a first aromatic group (Ar¹) that is an unfused ring system containing at least two aromatic groups linked by a bond or a first divalent linking moiety (X), which does not interfere with the synthesis, fabrication or use of the block copolymer,
(b) a first and a second azole ring fused with said first aromatic group, and
(c) a non-linear divalent organic moiety (L), which is not substantially rectilinear and does not interfere with the synthesis, fabrication or use of the block copolymer bonded by a single bond to the 2-carbon of the second azole ring.

22. The granular composition of claim 21 wherein the thermoplastic polybenzazole polymer blocks is represented by the Formula:

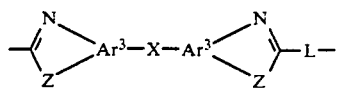

wherein:
X is a bond or a sulfonyl moiety, an atom, a sulfur atom or an aliphatic group;
each Ar³ is a carbocyclic aromatic group containing no more than about 12 carbon atoms;
L is a non-linear divalent organic moiety; and
each Z is —O—, —S— or —NR— wherein R is a hydrogen atom, a C₁-C₆ alkyl group or a phenyl ring.

23. The granular composition of claim 22 wherein the non-linear divalent organic moiety in the thermoplastic block of the block copolymer contains an m-phenylene moiety, an m-pyridinylene moiety, a 3,4'-biphenylene moiety, a 4,3'-biphenylene moiety, a 3,3'-biphenylene moiety or a 2,6-naphthalene moiety.

24. The granular composition of claim 22 wherein the non-linear divalent organic moiety in the thermoplastic block of the block copolymer is an aliphatic moiety having no more than about 12 carbon atoms, having two single bonds from either the same carbon atom or adjacent carbon atoms to two separate azole rings.

25. The granular composition of claim 24 wherein each non-linear divalent organic moiety in the thermoplastic block of the block copolymer is an alkyl group or perfluorinated alkyl group.

26. The granular composition of claim 22 wherein the non-linear divalent organic moiety in the thermoplastic block of the block copolymer contains two aromatic groups (Ar) linked by a second divalent linking moiety (X') which is a sulfonyl moiety, an oxygen atom, a sulfur atom or an aliphatic group.

27. The granular composition of claim 26 wherein the first and second divalent linking moieties in the thermoplastic block of the block copolymer are each individually a sulfonyl group or an oxygen atom.

28. The granular composition of claim 27 wherein each thermoplastic block in the block copolymer consists essentially of a plurality of mer units which are represented by the Formula:

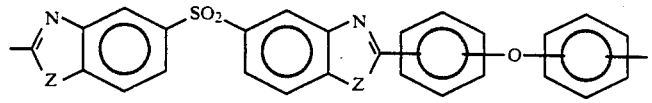

wherein each Z is an oxygen atom or a sulfur atom.

29. The granular composition of claim 20 wherein each thermoplastic block in the block copolymer is an aliphatic polybenzazole polymer.

30. The granular composition of claim 29 wherein each thermoplastic block in the block copolymer contains a plurality of mer units that each contain:
(1) an aromatic group (Arᵃ) having no more than about 12 carbon atoms;
(2) a first azole ring fused to said aromatic group; and
(3) an aliphatic group (R¹) having at least 3 carbon atoms bonded to the 2 carbon of said first azole ring.

31. The granular composition of claim 30 wherein each thermoplastic block in the block copolymer contains a plurality of mer units that each further contain:
(4) a second azole ring fused to said aromatic group (Arᵃ).

32. The granular composition of claim 31 wherein each thermoplastic block in the block copolymer contains a plurality of mer units which are represented by the Formula:

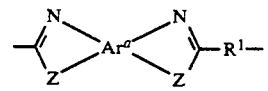

wherein:
R¹ is an alkyl group or perfluorinated alkyl group having 3-12 carbon atoms in which the illustrated bonds are not to the same carbon atom or to adjacent carbon atoms;
Arᵃ is the aromatic group having no more than about 12 carbon atoms; and
each Z is independently an oxygen atom or a sulfur atom.

33. The granular composition of claim 20 wherein each rigid rod polybenzazole polymer block contains on average between about 5 and about 150 mer units.

34. The granular composition of claim 20 wherein each azole ring in the block copolymer is independently an oxazole or a thiazole ring.

35. The granular composition of claim 20 wherein the ratio of rigid rod polybenzazole polymer to thermoplastic polybenzazole polymer is between 1/99 and 70/30 by inclusive weight.

36. The granular composition of claim 35 wherein the ratio of rigid rod polybenzazole polymer to thermoplastic polybenzazole polymer is no more than about 30/70 by weight.

37. The granular composition of claim 20 wherein the average particle size of the composition is between about 1μ and about 250μ.

38. A briquette containing a granular composition of claim 20.

39. A process for molding a shaped article comprising the step of molding a plurality of moldable particles, containing a block copolymer having at least one rigid rod polybenzazole polymer block and at least one thermoplastic polybenzazole polymer block selected such that the block copolymer is thermoplastic and can be compression molded without substantial phase separation, in a mold at a temperature at which the granular composition is flowable and a pressure sufficient to cause the granular composition to consolidate and conform to the shape of the mold.

40. A process for molding a shaped article comprising the step of molding a plurality of moldable particles, containing a block copolymer having at least one rigid rod polybenzazole polymer block and at least one thermoplastic polybenzazole polymer block selected such that the block copolymer is flowable at a temperature below its decomposition temperature, in a mold at a temperature at which the granular composition is flowable and a pressure sufficient to cause the granular composition to consolidate and conform to the shape of the mold.

41. A molded article comprising a block copolymer having at least one rigid rod polybenzazole polymer block and at least one thermoplastic polybenzazole polymer block, wherein said block copolymer is not substantially phase separated.

42. A block copolymer comprising:
   (a) at least one rigid rod polybenzazole block containing on average at least about 5 mer units and less than 10 mer units; and
   (b) at least one thermoplastic polybenzazole block linked to said rigid rod polybenzazole block
wherein the composition and proportions of the rigid rod polybenzazole block and the thermoplastic polybenzazole block are chosen such that the block copolymer becomes flowable at a temperature at which it does not substantially decompose.

43. The block copolymer of claim 42 wherein the rigid rod polybenzazole block and the thermoplastic polybenzazole block independently consist essentially of polybenzoxazole or polybenzothiazole mer units.

44. The block copolymer of claim 43 wherein the rigid rod block consists essentially AA/BB-PBZ mer units which are each individually represented by the Formula:

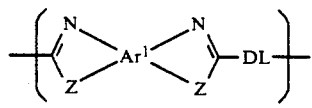

ps wherein Ar' is an aromatic group; DL is a divalent linking moiety chosen such that it does not interfere with the synthesis, fabrication or use of the polymer; and Z is an oxygen atom or a sulfur atom, all selected such that the rigid rod block contains rigid rod polymer.

45. The block copolymer of claim 44 wherein Ar¹ is a tetravalent 1,2,4,5-benzene ring and DM is a 1,4-phenylene ring.

46. The block copolymer of claim 43 wherein each rigid rod block contains on average at least about 8 mer units.

47. The block copolymer of claim 43 wherein the thermoplastic blocks are jointed polybenzazole polymer that contain repeating units represented by the Formula:

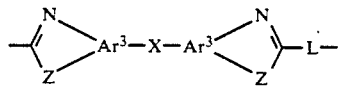

wherein:
   X is a bond or a sulfonyl moiety, an oxygen atom, a sulfur atom or an aliphatic group;
   each Ar³ is a carbocyclic aromatic group containing no more than about 12 carbon atoms;
   L is a non-linear divalent organic moiety; and each Z is —O— or —S—.

48. The block copolymer of claim 47 wherein L contains an m-phenylene moiety, an m-pyridinylene moiety, a 3,4'-biphenylene moiety, a 4,3'-biphenylene moiety, a 3,3'-biphenylene moiety or a 2,6-naphthalene moiety.

49. The block copolymer of claim 47 wherein L is an aliphatic moiety having no more than about 12 carbon atoms, having two single bonds from either the same carbon atom or adjacent carbon atoms to two separate azole rings.

50. The block copolymer of claim 47 wherein L contains two aromatic groups (Ar) linked by a second divalent linking moiety (X') which is a sulfonyl moiety, an oxygen atom, a sulfur atom or an aliphatic group.

51. The block copolymer of claim 43 wherein the thermoplastic block consists essentially of a plurality of mer units which are represented by the Formula:

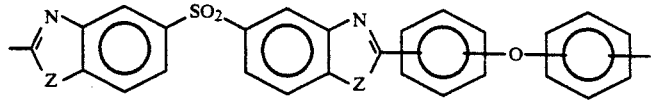

wherein each Z is an oxygen atom or a sulfur atom.

52. The block copolymer of claim 43 wherein the thermoplastic block contains a plurality of mer units which are represented by the Formula:

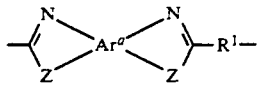

wherein:
R[1] is an alkyl group or perfluorinated alkyl group having 3-12 carbon atoms in which the illustrated bonds are not to the same carbon atom or to adjacent carbon atoms;
Ar[a] is the aromatic group having no more than about 12 carbon atoms; and
each Z is independently an oxygen atom or a sulfur atom.

53. The block copolymer of claim 43 wherein the ratio of rigid rod polybenzazole polymer to thermoplastic polybenzazole polymer is between 1/99 and 70/30, inclusive, by weight.

54. The granular composition of claim 52 wherein the ratio of rigid rod polybenzazole polymer to thermoplastic polybenzazole polymer is no more than about 30/70 by weight.

55. The process of claim 39 wherein the rigid rod polybenzazole block and the thermoplastic polybenzazole block each consist essentially of polybenzoxazole mer units or polybenzothiazole mer units.

56. The process of claim 55 wherein the temperature of molding is at least about 5° C. above the glass-transition temperature of the block copolymer.

57. The process of claim 55 wherein the pressure of molding is between 500 and 50,000 psi.

58. The process of claim 55 further comprising the step of annealing the molded product at a temperature above its glass-transition and below its melting point.

59. The process of claim 55 wherein the molded product is at least about ⅛ inch thick.

60. The process of claim 39 wherein the rigid rod polybenzazole block and the thermoplastic polybenzazole block each consist essentially of polybenzoxazole mer units or polybenzothiazole mer units.

61. The process of claim 60 wherein the temperature of molding is at least about 5° C. above the glass-transition temperature of the block copolymer.

62. The process of claim 60 wherein the pressure of molding is between 500 and 50,000 psi.

63. The process of claim 60 further comprising the step of annealing the molded product at a temperature above its glass-transition and below its melting point.

64. The process of claim 60 wherein the molded product is at least about ⅛ inch thick.

65. The molded article of claim 41 wherein the rigid rod polybenzazole block and the thermoplastic polybenzazole block each consist essentially of polybenzoxazole mer units or polybenzothiazole mer units.

66. The molded article of claim 65 wherein the polymer is planar isotropic.

67. The molded article of claim 65 wherein the polymer is isotropic in all three dimensions.

68. The molded article of claim 65 wherein the molded article is at least about ⅛-inch thick.

* * * * *